(12) United States Patent
Lee et al.

(10) Patent No.: US 8,259,089 B2
(45) Date of Patent: Sep. 4, 2012

(54) ELECTRONIC DEVICE AND TOUCH SENSOR FILM

(75) Inventors: Do-Kwang Lee, Ansan-si (KR); Sun-Woong Shin, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 548 days.

(21) Appl. No.: 12/492,904

(22) Filed: Jun. 26, 2009

(65) Prior Publication Data
US 2009/0322709 A1 Dec. 31, 2009

(30) Foreign Application Priority Data
Jun. 30, 2008 (KR) .................... 10-2008-0062732

(51) Int. Cl.
*G06F 3/042* (2006.01)
(52) U.S. Cl. .................... 345/176; 345/173; 345/156
(58) Field of Classification Search ......... 345/156–173; 315/312; 178/18.11
See application file for complete search history.

(56) References Cited

U.S. PATENT DOCUMENTS

| | | | |
|---|---|---|---|
| 7,936,983 B2 * | 5/2011 | Konno et al. ................ 396/14 |
| 7,948,179 B2 * | 5/2011 | Koshihara et al. ............ 313/512 |
| 2007/0068789 A1 | 3/2007 | Streifler |
| 2008/0036746 A1 * | 2/2008 | Klinghult ................... 345/176 |
| 2008/0055863 A1 | 3/2008 | Cho et al. |
| 2008/0100580 A1 * | 5/2008 | Han ........................... 345/168 |
| 2008/0117182 A1 * | 5/2008 | Um et al. .................... 345/173 |
| 2008/0266273 A1 * | 10/2008 | Slobodin et al. ............ 345/174 |
| 2009/0021492 A1 * | 1/2009 | Wu et al. ..................... 345/175 |

FOREIGN PATENT DOCUMENTS
WO 2004107062 9/2004

OTHER PUBLICATIONS

EPO Partial Search Report dated Oct. 21, 2009.
EPO Extended Search Report dated Jan. 14, 2010.

* cited by examiner

*Primary Examiner* — Nitin Patel
(74) *Attorney, Agent, or Firm* — H.C. Park & Associates, PLC

(57) ABSTRACT

An electronic device includes a light-emitting board, a touch sensor film and a signal connection part. The light-emitting board includes a driving substrate, and a semiconductor device disposed on a surface of the driving substrate. The touch sensor film includes a film disposed over the light-emitting board, and a touch conductor pattern formed on the film to sense an external touch event for generating a touch signal to drive the semiconductor device. The signal connection part electrically connects the touch sensor film and the light-emitting board to each other to transmit the touch signal from the touch sensor film to the light-emitting board.

16 Claims, 3 Drawing Sheets

ELECTRONIC DEVICE AND TOUCH SENSOR FILM

CROSS REFERENCE TO RELATED APPLICATION

This application claims priority from the benefit of Korean Patent Application No. 2008-62732, filed on Jun. 30, 2008, which is hereby incorporated by reference for all purposes as if fully set forth herein.

BACKGROUND OF THE INVENTION

1. Field of the Invention

Exemplary embodiments of the present invention relate to an electronic device and a touch sensor film for the electronic device or, more particularly, to an electronic device operating in response to a touch event of a user, and a touch sensor film for the electronic device.

2. Discussion of the Background

A light-emitting diode (LED) has qualities such as high efficiency, long lifespan, low power consumption, being environmentally friendly, etc., as a light source. Therefore, the LED is widely used in various industrial fields.

In general, an electronic device may include a light-emitting board including an LED to generate light, a cover mold covering the light-emitting board, and a film disposed over the light-emitting board to enhance characteristics of the light. For example, a light-diffusing film may be employed as the film.

An electronic device which has been recently developed may be operated in response to an external touch event. In order for that, the electronic device may include a touch sensor for sensing a touch event to drive the light-emitting board.

In general, the light-diffusing film is attached to an upper surface of the cover mold through a double-sided tape, and the touch sensor film is also attached to an upper surface of the light-diffusing film through another double-sided tape.

Therefore, according to the conventional electronic device with touch sensing function, which is described above, the light-diffusing film for diffusing light and the touch sensor film for sensing a touch event are separately equipped, and separate processes are required for attaching the light-diffusing film and the touch sensor film, so that manufacturing cost increases and manufacturing process becomes complicated.

SUMMARY OF THE INVENTION

Exemplary embodiments of the present invention provide an electronic device capable of reducing the number of components to lower manufacturing cost thereof.

Exemplary embodiments of the present invention also provide a touch sensor film for the electronic device.

Additional features of the invention will be set forth in the description which follows, and in part will be apparent from the description, or may be learned by practice of the invention.

An exemplary embodiment of the present invention discloses an electronic device with a light-emitting board having a driving substrate, and a semiconductor device disposed on the driving substrate; a touch sensor film that has a film disposed on or over the light-emitting board, and a touch conductor pattern formed on the film; and a signal connection part that is electrically connects the touch sensor film and the light-emitting board with each other.

An exemplary embodiment of the present invention also discloses a touch sensor film having a film enhancing characteristics of light and a touch conductor pattern disposed on the film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
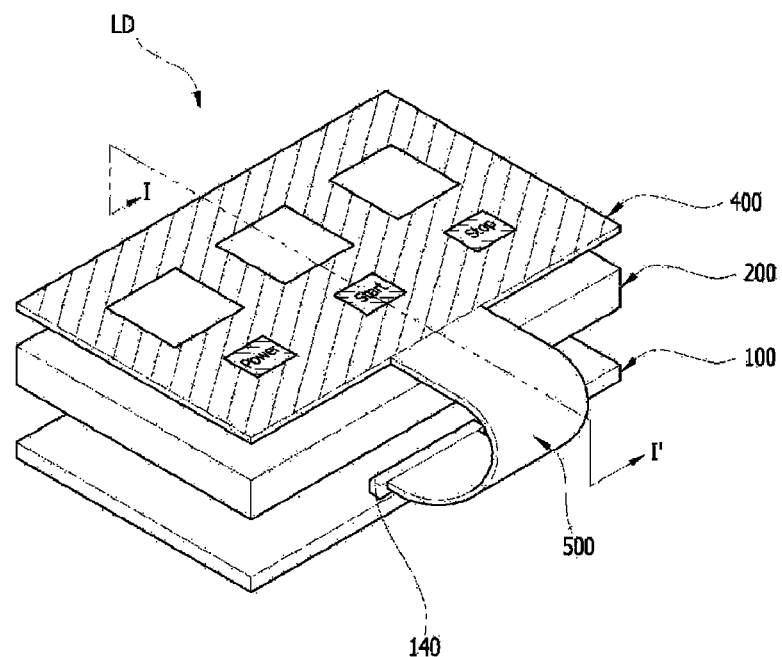
FIG. 1 is a perspective view illustrating an electronic device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
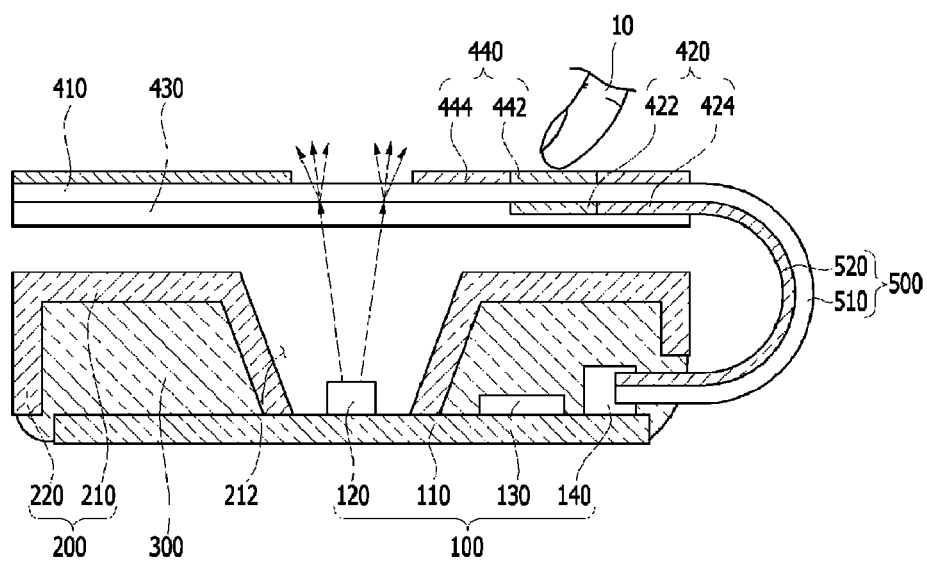
FIG. 2 is a cross-sectional view taken along line I-I' in FIG. 1.

FIG. 1 is a perspective view illustrating an electronic device according to a first exemplary embodiment of the present invention, and FIG. 2 is a cross-sectional view taken along line I-I' in FIG. 1.

Referring to FIG. 1 and FIG. 2, an electronic device LD according to the present exemplary embodiment includes a light-emitting board 100, a cover mold 200, a molding portion 300, a touch sensor film 400 and a signal connection part 500.

The light-emitting board 100 may include a driving substrate 110, at least one semiconductor device 120, a driving device 130, and a connector 140. The driving substrate 110 may be, for example, a printed circuit board (PCB) having a plurality of wirings. The semiconductor device 120, the driving device 130, and the connector 140 are mounted on a first surface of the driving substrate 110. The connector 140 receives a touch signal from the touch sensor film 400 through the signal connection part 500 to transmit the touch signal to the driving device 130, and the driving device 130 controls the semiconductor device 120 in response to the touch signal.

For example, the semiconductor device 120 may be a light emitting diode (LED) that operates as a point light source. In detail, the semiconductor device 120 may include at least one of a red LED, a green LED, and a blue LED, or a white LED. Alternatively, the semiconductor device 120 may include an organic light-emitting diode (OLED).

The cover mold 200 is disposed over the driving substrate 110 to cover the first surface of the driving substrate 110. In detail, the cover mold 200 may include a mold cover portion 210 and a mold sidewall portion 220. The mold cover portion 210 is disposed over the driving substrate 110 to cover the driving substrate 110. The mold cover portion 210 may include a light-emitting recess 212 exposing the semiconductor device 120. The mold sidewall portion 220 is formed along edges of the mold cover portion 210 facing the driving substrate 110. Therefore, the mold cover portion 210 and the mold sidewall portion 220 may define a receiving space for receiving the light-emitting board 100.

The molding portion 300 is disposed between the light-emitting board 100 and the cover mold 200 to cover the first surface of the driving substrate 110. Furthermore, the molding portion 300 fills a space between the light-emitting board 100 and the cover mold 200 to combine the cover mold 200 and the light-emitting board 100. The molding portion 300 does not cover the semiconductor device 120 in FIG. 2, but the molding portion 300 may cover the semiconductor device 120.

The touch sensor film 400 is disposed over the cover mold 200, and electrically connected to light-emitting board 100 through the signal connection part 500. The touch sensor film 400 senses an external touch event and generates a touch signal to transmit the touch signal to the light-emitting board 100. For example, the touch sensor film 400 may include a film 410, a touch conductor pattern 420, an adhesive layer 430 and a display panel layer 440.

The film 410 is disposed over the cover mold 200 and may improve optical characteristics. In other words, the film 410 may be an optical characteristics enhancing film. For example, a light-diffusing film diffusing light generated by the semiconductor device 120 to exit the light-emitting recess 212 of the mold cover portion 210 may be used as the film 410. That is, the film 410 may be a light-diffusing film for diffusing light.

The touch conductor pattern 420 is formed on a lower surface of the film 410, the lower surface facing the mold cover 200. The touch conductor pattern 420 senses an external touch event to generate a touch signal. In detail, the touch conductor pattern 420 includes a touch sensor pattern 422 and a touch wiring 424.

The touch sensor pattern 422 senses the touch event for generating the touch signal. The touch event may be an external compression, magnetic force, electric force, electromagnetic wave, light, etc. For example, the touch sensor pattern 422 senses electric charges of a finger 10 of a user to generate the touch signal. The touch wiring 424 extends from the touch sensor pattern 422 toward an end portion of the lower surface of the film 410 to be electrically connected to the signal connection part 500. Therefore, the touch wiring 424 transmits the touch signal to the signal connection part 500.

The touch conductor pattern 420 may include an optically transparent and electrically conductive material. For example, the touch conductor pattern 420 may include indium tin oxide (ITO) or indium zinc oxide (IZO).

The adhesive layer 430 is formed on the lower surface of the film 410 to cover the touch conductor pattern 420. The adhesive layer 430 attaches the film 410 to the upper surface of the cover mold 200. The adhesive layer 430 may be optically transparent, so that the adhesive layer 430 may transmit light.

The display panel layer 440 is formed on an upper surface of the film 410, the upper surface being opposite to the cover mold 200. The display panel layer 440 may indicate a region where the touch event is sensed. Additionally, the display panel layer 440 may have various images, characters, etc., which are indicating status, menu, etc.

For example, the display panel layer 440 may include a touch region portion 442 corresponding to the touch sensor pattern 422 to sense the touch event, and a cover region portion 444 blocking light or changing colors of the light.

The signal connection part 500 electrically connects the touch sensor film 400 and the light-emitting board 100 to each other, so that signal connection part 500 transmits the touch signal generated by the touch conductor pattern 420 to the light-emitting board 100.

In the present exemplary embodiment, the signal connection part 500 is integrally formed with the touch sensor film 400, and an end portion thereof is inserted into the connector 140 of the light-emitting board 100 to be electrically connected to the connector 140. In detail, the signal connection part 500 includes a connection base film 510 and a connection wiring 520.

The connection base film 510 is extended from the end portion of the film 410 in parallel with the film 410, and a center portion of the connection base film 510 is bended, so that an end portion is inserted into the connector 140. The connection wiring 520 is formed on a lower surface of the connection base film 510, which faces the cover mold 200. The connection wiring 520 is electrically connected to the touch wiring 424 of the touch conductor pattern 420, and an end portion of the connection wiring 520 is electrically connected to the connector 140.

As described above, according to the present exemplary embodiment, the touch conductor pattern 420 for sensing a touch event is formed directly on the lower surface of the film 410 for improving characteristics of light, unlike the conventional electronic device having a touch sensor film for sensing a touch event and a light characteristics enhancing film. Therefore, the number of components of the electronic device LD may be reduced to reduce manufacturing cost and the number of manufacturing processes.

Figure 3:
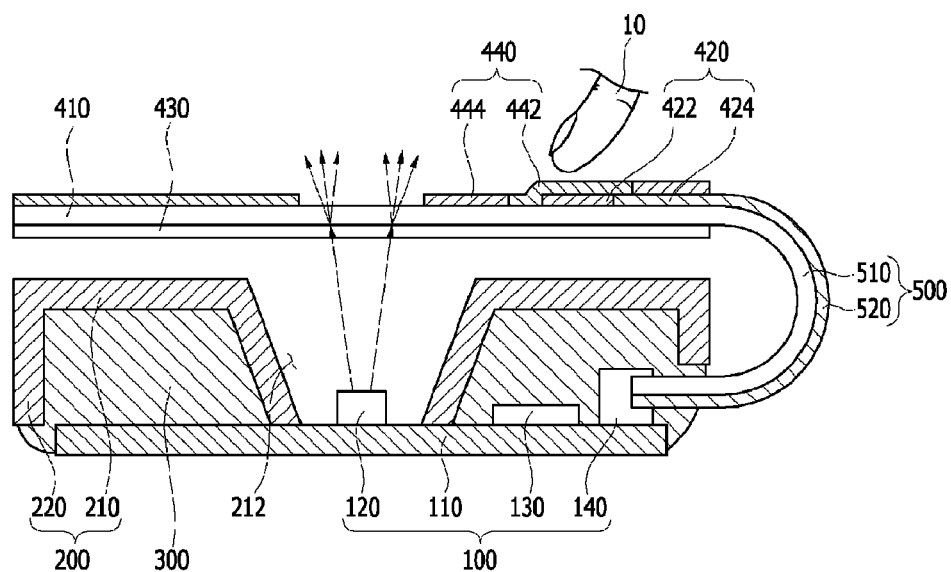
FIG. 3 is a cross-sectional view illustrating an electronic device according to a second exemplary embodiment of the present invention.

FIG. 3 is a cross-sectional view illustrating an electronic device according to a second exemplary embodiment of the present invention.

The electronic device according to the present exemplary embodiment is substantially the same as the electronic device in FIG. 1 and FIG. 2, except for the position of the touch conductor pattern 420 and elements relating thereto. Thus, same reference numerals will be used for the same elements, and any further explanation will be omitted.

Referring to FIG. 3, the touch conductor pattern 420 is formed on an upper surface of the film 410, which is opposite to the mold cover 200. The touch conductor pattern 420 senses an external touch event for generating a touch signal.

The display panel layer 440 is formed on an upper surface of the film 410 to cover the touch conductor pattern 420, and a connection wiring 520 of the signal connection part 500 is formed on an upper surface of the connection base film 510, which is opposite to the cover mold 200. The connection wiring 520 is electrically connected to a touch wiring 424 of the touch conductor pattern 420, and an end portion of the connection wiring 520 is electrically connected to the connector 140.

Figure 4:
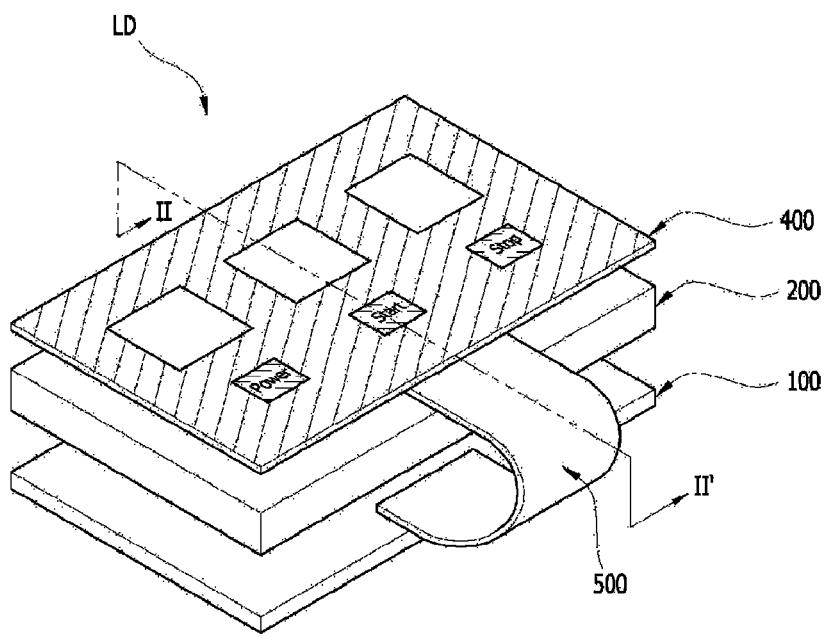
FIG. 4 is a perspective view illustrating an electronic device according to a third exemplary embodiment of the present invention.
Figure 5:
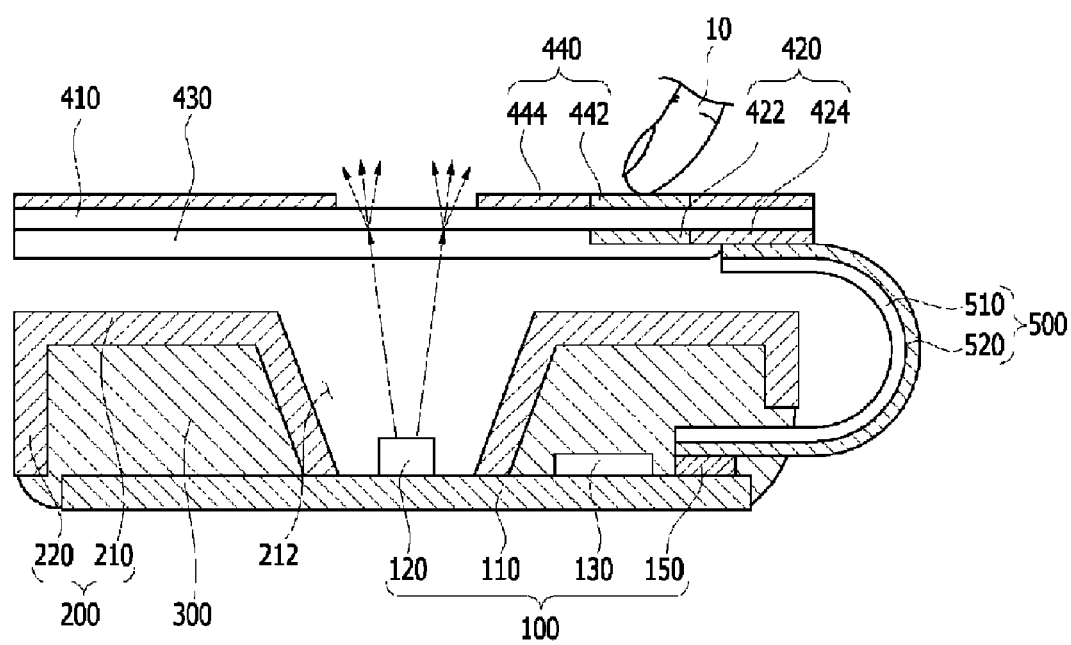
FIG. 5 is a cross-sectional view taken along line II-II' in FIG. 4.

FIG. 4 is a perspective view illustrating an electronic device according to a third exemplary embodiment of the present invention, and FIG. 5 is a cross-sectional view taken along line II-II' in FIG. 4.

The electronic device according to the present exemplary embodiment is substantially the same as the electronic device in FIG. 1 and FIG. 2, except for the signal connection part 500 and elements relating thereto. Thus, same reference numerals will be used for the same elements, and any further explanation will be omitted.

Referring to FIG. 4 and FIG. 5, a signal connection part 500 according to the present exemplary embodiment electrically connects the touch sensor film 400 and the light-emitting board 100 to each other to transmit a touch signal generated by the touch conductor pattern 420 to the light-emitting board 100.

The signal connection part 500 is separately formed from the touch sensor film 400, and electrically connects the touch sensor film 400 and the light-emitting board 100 to each other. In detail, the signal connection part 500 includes a connection base film 510 and a connection wiring 520.

The connection base film 510 is separately formed from the film 410, and a first end portion of the connection base film 510 overlaps with lower end portion of the film 410. A center portion of the connection base film 510 is bent, so that a second end portion of the connection base film 510, which is opposite to the first end portion, overlaps with a portion of the driving substrate 110. The driving substrate 110 may include a connection pad 150 formed on the first surface thereof, instead of the connector 140 in FIG. 1 and FIG. 2. The connection pad 150 is electrically connected to the driving device 130.

A first end portion of the connection wiring 520 is electrically connected to the touch wiring 424 in a region where the connection base film 510 and the film 410 overlap with each other, and a second end portion of the connection wiring 520 is electrically connected to the connection pad 150 in a region where the connection base film 510 and the driving substrate 110 overlap with each other.

The connection wiring 520 and the touch wiring 424 or the connection wiring 520 and the connection pad 150 may be electrically connected to each other through an anisotropic conductive film (ACF) having a plurality of conductive balls distributed therein.

Alternatively, the touch sensor film 400 and the light-emitting board 100 may be electrically connected to each other through other methods not shown in FIG. 1, FIG. 2, FIG. 3, FIG. 4, and FIG. 5. For example, the touch sensor film 400 and the light-emitting board 100 may be electrically connected to each other through a connection pin and a socket.

As described above, according to exemplary embodiments of the present invention, the touch conductor pattern for sensing a touch event is formed directly on the lower surface of the film for improving characteristics of light, unlike the conventional electronic device having a touch sensor film for sensing a touch event and a light characteristics enhancing film. Therefore, the number of components of the electronic device LD may be reduced to reduce manufacturing cost and the number of manufacturing processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electronic device, comprising:
a light-emitting board comprising a driving substrate, and a light-emitting semiconductor device disposed on the driving substrate;
a touch sensor comprising a film disposed on or over the light-emitting semiconductor device, the film to be penetrated by light generated by the semiconductor device, and a touch conductor pattern disposed on the film of the touch sensor to sense an external touch event for generating a touch signal to drive the semiconductor device; and
a signal connection part electrically connecting the touch sensor and the light-emitting board to each other to transmit the touch signal from the touch sensor to the light-emitting board.

2. The electronic device of claim 1, wherein the film of the touch sensor is a light characteristics enhancing film.

3. The electronic device of claim 2, wherein the film of the touch sensor diffuses light generated by the semiconductor device.

4. The electronic device of claim 1, wherein the touch conductor pattern is disposed on an upper surface of the film of the touch sensor or on a lower surface of the film of the touch sensor.

5. The electronic device of claim 1, wherein the signal connection part comprises:
a connection base film; and
a connection wiring disposed on the connection base film, the connection wiring being electrically connected to the touch conductor pattern and to the light-emitting board.

6. The electronic device of claim 5, wherein the connection base film extends from the film of the touch sensor.

7. The electronic device of claim 5, wherein the connection base film is spaced apart from the film of the touch sensor and a portion of the connection base film overlaps with a portion the film of the touch sensor, and
the connection wiring and the touch conductor pattern are electrically connected to each other in a region where the film of the touch sensor and the connection base film overlap with each other.

8. The electronic device of claim 5, wherein the light-emitting board further comprises a connector disposed on the driving substrate, the connector being combined with an end portion of the signal connection part that is electrically connected to the connection wiring.

9. The electronic device of claim 5, wherein the connection base film overlaps with a portion of the driving substrate, and
the connection wiring is electrically connected to a connection pad disposed on the portion of the driving substrate.

10. The electronic device of claim 1, further comprising a cover mold disposed between the light-emitting board and the touch sensor.

11. The electronic device of claim 10, wherein the touch sensor further comprises an adhesive layer disposed on a lower surface of the film of the touch sensor, the lower surface facing the cover mold, the adhesive layer attaching the film of the touch sensor to the cover mold.

12. The electronic device of claim 1, wherein the touch sensor further comprises a display panel layer disposed on an upper surface of the film of the touch sensor, the upper surface being opposite to the light-emitting board.

13. The electronic device of claim 1, wherein the light-emitting board further comprises a driving device disposed on the driving substrate, the driving device being electrically connected to the signal connection part and the semiconductor device.

14. The electronic device of claim 1, wherein the semiconductor device is a light-emitting diode or an organic light-emitting diode.

15. A touch sensor, comprising:
a film enhancing characteristics of light to be penetrated by light, wherein light enters the film through a first of the two large faces of the film and exits the film through a second face, disposed opposite to the first, of the two large faces of the film, and a touch conductor pattern disposed on the film.

16. The touch sensor of claim 15, wherein the touch conductor pattern comprises one of an optically transparent material and an electrically conductive material.

* * * * *